(12) United States Patent
Hauser et al.

(10) Patent No.: US 7,639,508 B2
(45) Date of Patent: Dec. 29, 2009

(54) FASTENING OF A BUILT-IN UNIT ON A SWITCHBOARD AND FITTING METHOD FOR FASTENING A BUILT-IN UNIT

(75) Inventors: Rainer Hauser, Nürnberg (DE); Christian Schwarz, Zirndorf (DE); Michael Tiegelkamp, Pyrbaum (DE)

(73) Assignee: Siemens Aktiengesellschaft, Munich (DE)

( * ) Notice: Subject to any disclaimer, the term of this patent is extended or adjusted under 35 U.S.C. 154(b) by 25 days.

(21) Appl. No.: 12/153,489

(22) Filed: May 20, 2008

(65) Prior Publication Data
US 2008/0291644 A1 Nov. 27, 2008

(30) Foreign Application Priority Data
May 21, 2007 (DE) .................. 10 2007 023 616

(51) Int. Cl.
*H05K 5/00* (2006.01)
(52) U.S. Cl. ...................... 361/759; 361/801
(58) Field of Classification Search ................ 361/759, 361/790, 797, 800–802, 807–810
See application file for complete search history.

(56) References Cited

U.S. PATENT DOCUMENTS 5,169,097 A * 12/1992 Yasukawa .................. 248/27.1
5,865,403 A * 2/1999 Covell ....................... 248/27.1
6,313,980 B1 * 11/2001 Craft et al. .................. 361/627
6,529,381 B1 * 3/2003 Schoenfish .................. 361/725

* cited by examiner

Primary Examiner—Hung S Bui
(74) Attorney, Agent, or Firm—Harness, Dickey & Pierce, P.L.C.

(57) ABSTRACT

At least one embodiment of the invention relates to the fastening and fitting of a built-in unit on a switchboard, which has a through-opening for this purpose, a collar, which is arranged on the built-in, limiting the action of plugging through the built-in unit, and at least one fixing and clamping device ensuring that the built-in unit is pressed correspondingly against the switchboard. In order to specify simple fastening including fitting which can be carried out by a single person, at least one embodiment of the invention proposes that holders arranged on both sides of the built-in unit and having mounts with holding lugs, which are arranged thereon and engage in corresponding depressions and/or apertures of the built-in unit, are provided, that each mount has a web, on which a slide, which latches in stepwise, can be moved toward the switchboard rear side, as a result of which it presses the holding lugs against the depressions and/or apertures and thus fixes the built-in unit in the through-opening first in the intended position, and that sealing of the through-opening takes place by means of clamping elements, which press against the switchboard rear side.

8 Claims, 4 Drawing Sheets

FASTENING OF A BUILT-IN UNIT ON A SWITCHBOARD AND FITTING METHOD FOR FASTENING A BUILT-IN UNIT

PRIORITY STATEMENT

The present application hereby claims priority under 35 U.S.C. §119 on German patent application number DE 10 2007 023 616.8 filed May 21, 2007, the entire contents of which is hereby incorporated herein by reference.

FIELD

Embodiments of the invention generally relate to a fastening of a built-in unit on a switchboard and/or a fitting method for fastening a built-in unit.

BACKGROUND

It is known to fasten built-in units on switchboards. For this purpose, the built-in units usually have a collar. For fitting purposes, they are plugged into a through-opening (for example an aperture) of the switchboard from the switchboard front side until the collar comes to bear approximately against the switchboard front side. The outer contour (of the rear part) of the built-in unit in this case corresponds in terms of shape and size to the through-opening. The built-in unit is positioned on the switchboard by means of clamps which are positioned at the corners and which also fix the built-in unit. Screws are used for the final fastening. In this case, the collar for sealing the switchboard is provided on the inside with a circumferential injection-molded seal.

It is further known to plug plastic clamps on at the corners of the housing of the built-in unit and to fix and fasten the built-in unit by way of the latching function of the plastic clamps.

One disadvantage with the known fastenings of built-in units is the fact that often a second person is required during fitting, in particular in the case of large switchboards.

SUMMARY

In at least one embodiment of the invention, a simple, sealed fastening including a simple fitting method is disclosed for built-in units which can be carried out by a single person.

In relation to the fastening, at least one embodiment provides that the fixing and clamping devices include holders, which are arranged on both sides of the built-in unit, with at least two holding lugs, which are spaced apart from one another, are arranged on a mount and engage in corresponding depressions and/or apertures of the built-in unit, and that each mount has, for the purpose of fitting the built-in unit, a web which runs transversely with respect to the mount and on which a slide, which latches in stepwise in the direction of the mount, can be moved toward the switchboard rear side, as a result of which it presses the holding lugs against the depressions and/or apertures and thus fixes the built-in unit in the through-opening at first in the intended position, and that the holding lugs are pressed so severely against the depressions and/or apertures by means of clamping elements, which are arranged on the mount and press against the switchboard rear side, that sealing of the through-opening takes place. The built-in unit which is plugged through as far as the collar is therefore fixed from the switchboard rear side by a single person with the aid of the two holders and already prestressed before it is pressed so severely against the mount by means of the clamping elements that, in addition to the desired fastening of the built-in unit, sealing of the through-opening takes place.

A technically simple embodiment provides screws as clamping elements, the ends of said screws bearing against the switchboard rear side and therefore pressing the holding lugs, when screwed in, against the depressions and/or apertures.

For simple fitting, it is proposed that an elastic material is arranged between the collar and the switchboard front side for sealing purposes.

Fitting is simplified if the elastic material is applied to the inside of the collar.

In relation to the fitting method, at least one embodiment of the invention provides that the fixing and clamping means in the form of holders with at least two holding lugs, which are spaced apart from one another, are applied on both sides of the built-in unit, the holding lugs being arranged on a mount and engaging in corresponding depressions and/or apertures of the built-in unit, and that a slide, which latches in stepwise, is moved on a web, which runs transversely with respect to the mount, toward the switchboard rear side in order to press the holding lugs against the depressions and/or apertures and thus to fix the built-in unit first in the through-opening in the intended position, and that then the holding lugs are pressed so severely against the depressions and/or apertures by way of clamping elements, which are arranged on the mount and press against the switchboard rear side, that sealing of the through-opening takes place.

BRIEF DESCRIPTION OF THE DRAWINGS

The invention will be described by way of example below with reference to a drawing, in which.

DETAILED DESCRIPTION OF THE EXAMPLE EMBODIMENTS

Figure 1:
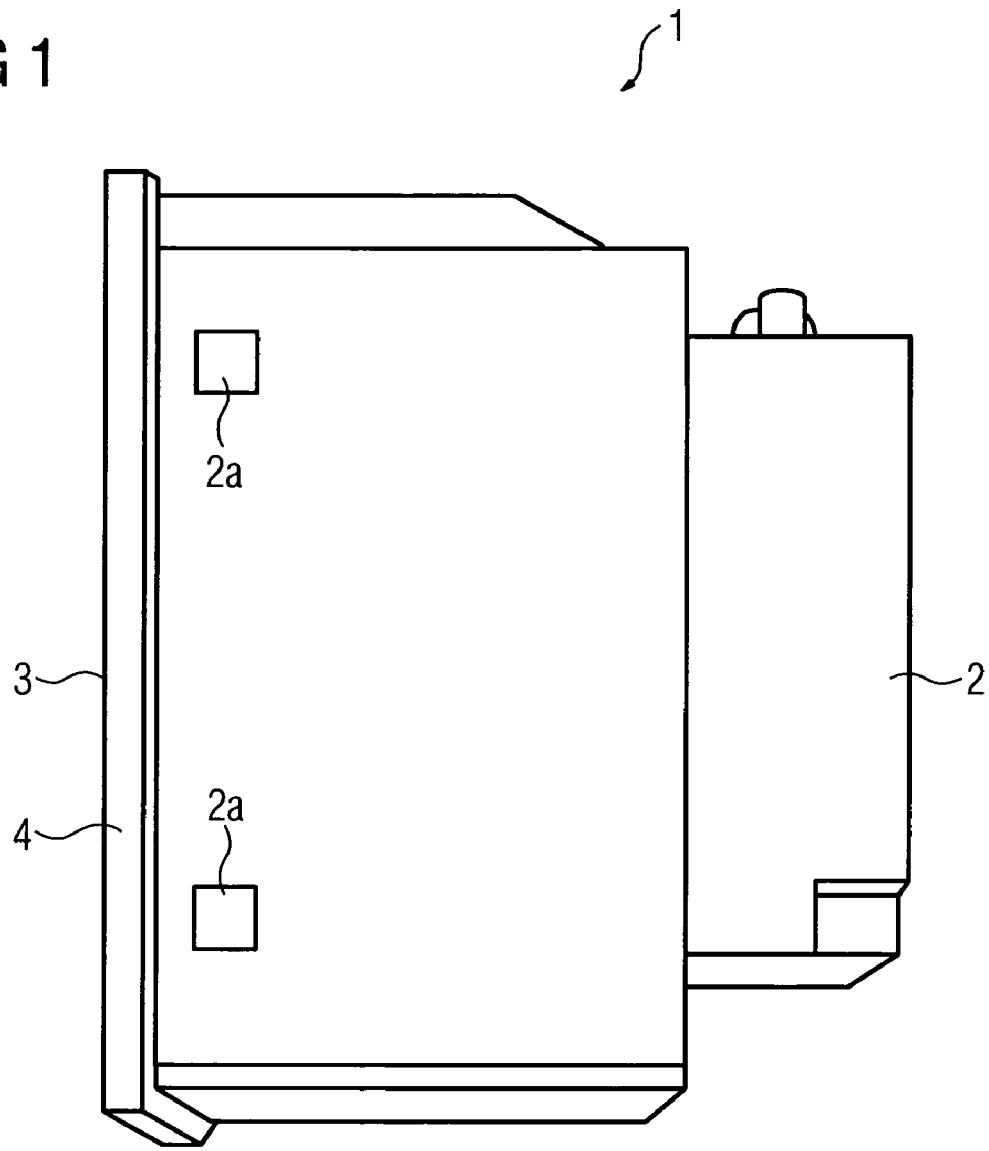
FIG. 1 shows a built-in unit when viewed from the side.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1 shows a built-in unit with a housing 2, which has a collar 4 on its front side 3. Apertures 2a, which could also be in the form of depressions, are located on the housing 2.

Figure 2:
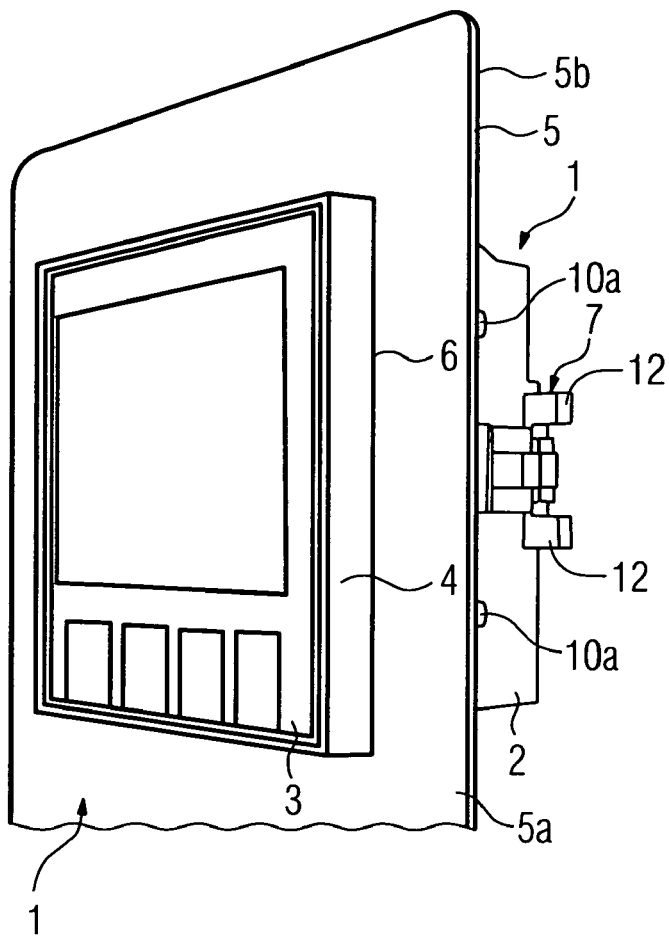
FIG. 2 shows the built-in unit shown in FIG. 1 when fastened on a switchboard by way of two laterally arranged holders.

FIG. 2 shows the built-in unit 1 which has already been fastened on a switchboard 5, the collar 4 bearing (under pressure) against the switchboard front side 5a. An injection-molded circumferential seal 6 made from an elastic material is located for sealing purposes between the switchboard 5 and the collar 4.

The built-in unit 1 is plugged through a through-opening 15 (see FIG. 7), which is hidden by the front side 3 including the collar 4, and extends into the area behind the switchboard 5, as can be seen in FIG. 2. Two holders 7, which bear on both sides opposite one another against the built-in unit 1, are used for fastening the built-in unit 1, with only one of the two holders 7, and also only part of said holder, being shown in FIG. 2.

Figure 3:
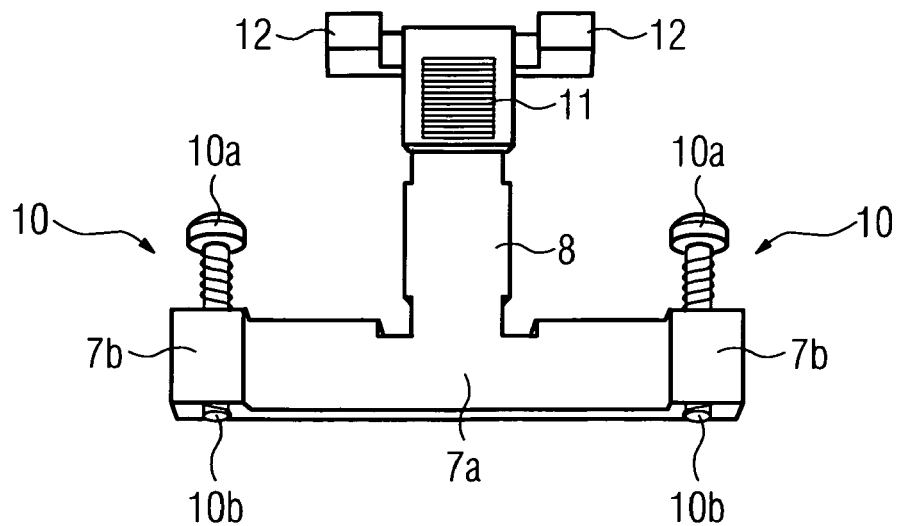
FIG. 3 shows the mount of the holder shown in FIG. 2 when viewed from the front.
Figure 4:
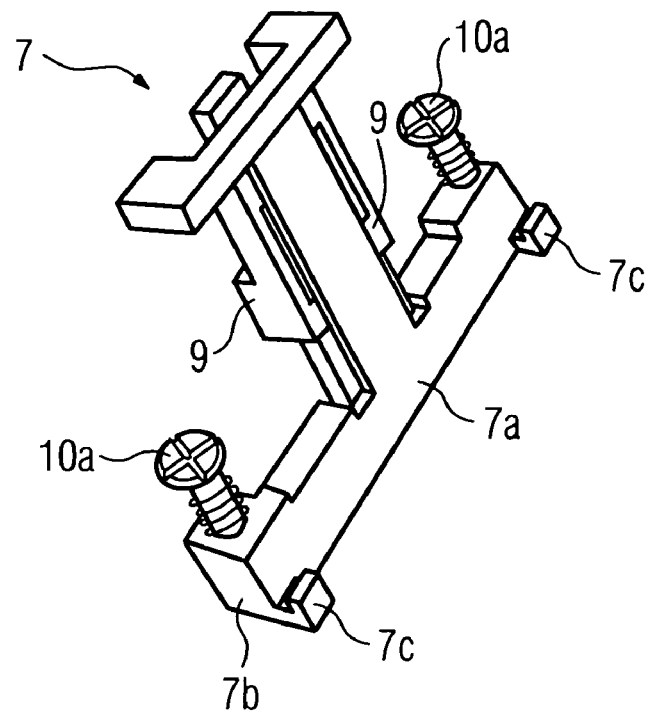
FIG. 4 shows the mount of the holder shown in FIG. 3 when viewed from the rear.
Figure 5:
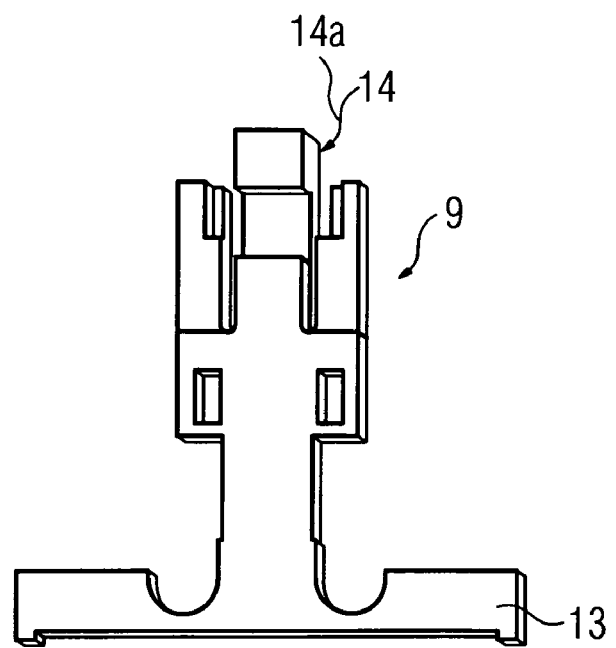
FIG. 5 shows the slide of the holder shown in FIG. 2.

FIGS. 3, 4 and 5 show the two parts of the holder 7, FIG. 3 shows a mount 7a with a web 8 integrally formed thereon and FIG. 5 shows a slide 9.

On the mount 7a in FIG. 3, screws 10a are screwed in transversely with respect to the longitudinal extent of the mount 7a at the mount ends 7b in the form of clamping elements 10, which screws 10a run parallel to the web 8, the ends 10b of the screws 10a peeping slightly out of the mount 7a at the bottom. On the web 8, latching grooves 11 are formed at the upper end of said web which is remote from the mount 7a. In FIG. 3, lateral holding elements 12 for the fingers of the fitter for holding purposes during installation of the built-in unit 1 extend toward the right and left over the latching grooves 11.

FIG. 4 shows the holder 7 from the side which bears against the housing 2 in FIG. 2. On this bearing side, corresponding projections in the form of holding lugs 7c are located on the mount 7a at the mount ends 7b toward the apertures 2a (see FIG. 1).

The slide 9 shown in FIG. 5 has a pressure strip 13 extending on both sides transversely with respect to the slide at its lower end. At least one latching lug 14 is formed on that side of the slide 9 which is remote in FIG. 5, which is indicated by the tip of the arrow 14a.

Figure 6:
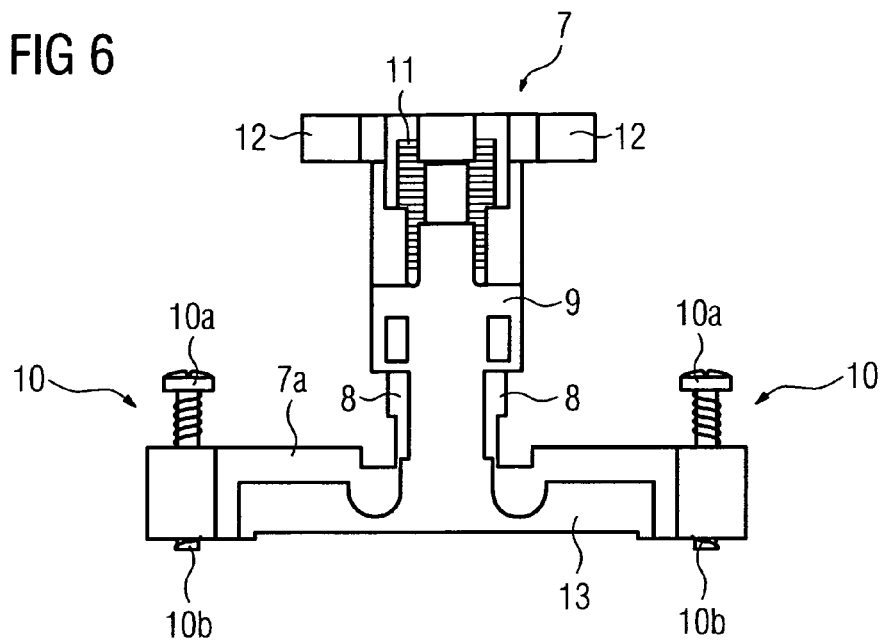
FIG. 6 shows the assembled holder shown in FIGS. 3 and 5 with the mount and the slide.

FIG. 6 shows the two parts of the holder 7 in the fitted state, in which the slide 9 has been simply pushed onto the web 8 on the mount 7. In this state, the latching lug 14 (not illustrated in any further detail) engages in each case in the grid 11.

Figure 7:
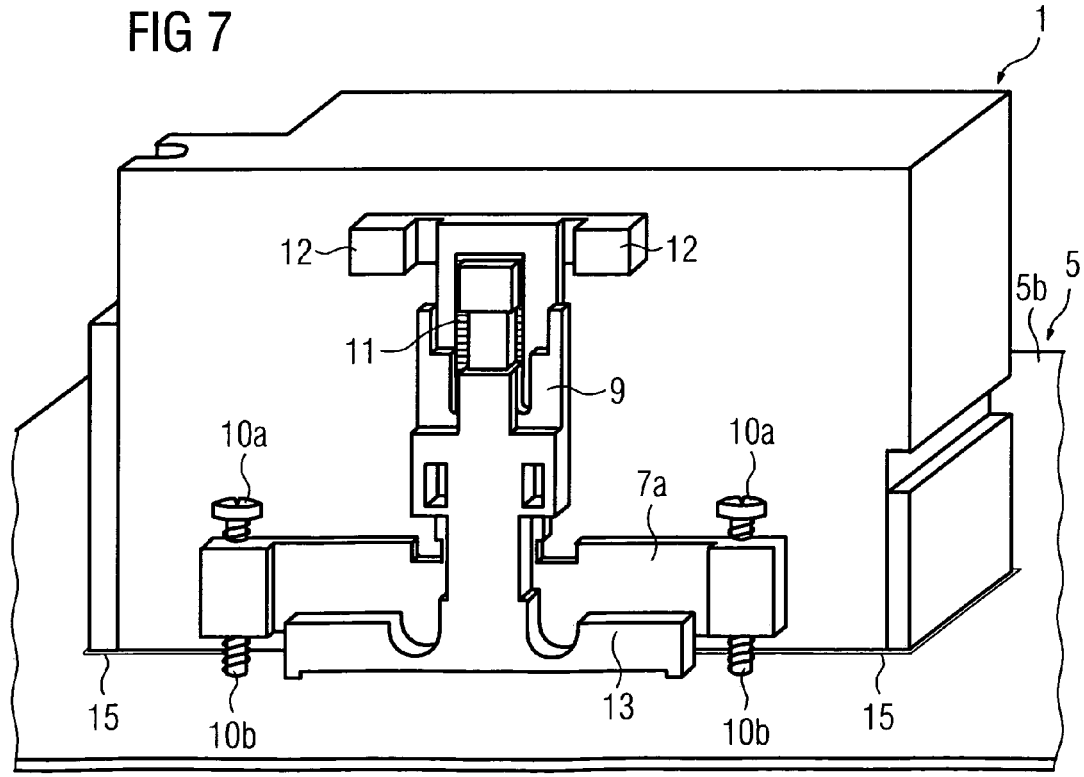
FIG. 7 shows the built-in unit fastened on the switchboard with a view of the holder arranged laterally on the built-in unit.

FIG. 7 shows the fastened built-in unit 1 shown in FIG. 2 when viewed from the rear, with the view being directed directly at one of the two holders 7 arranged on both sides. In this case, the two lugs 7c engage in the apertures 2a provided for this purpose on the housing 2 of the built-in unit 1, and the screws 10a press the lugs 7c against the apertures 2a, the ends 10b of the screws 10a being supported on the switchboard. In this case, the seal 6 of the collar 4 is pressed tightly against the switchboard 5.

The fitting of the built-in unit 1 takes place in such a way that the lugs 7c are plugged into the apertures 2a, to be precise by means of applying the two holders 7. Then, the slide 9 is pressed downwards until the pressure strip 13 bears against the switchboard rear side 5b and the built-in unit 1 is held under a slight pressure in its position. In order to increase the contact-pressure, the screws 10a are then tightened.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as; a departure from the spirit and scope of the present invention, and all such modifications as would be obvious to one skilled in the art are intended to be included within the scope of the following claims.

What is claimed is:

1. A fastening of a built-in unit on a switchboard including a through-opening through which a rear part of the built-in unit is plugged from the switchboard front side, the rear part of the built-in unit and a contour and size of the through-opening corresponding to one another, a collar being arranged on the built-in unit to limit the action of plugging through the built-in unit, the fastening comprising:

at least one fixing and clamping device on the rear part of the built-in unit to enable the built-in unit to assume an intended position on the switchboard and to enable the collar to be pressed with such a pressure against the switchboard that sealing of the through-opening device including holders arranged on both sides of the built-in unit, and at least two holding lugs, spaced apart from one another, arranged on a mount to engage in corresponding at least one of depressions and apertures of the built-in unit, each mount including, to fit the built-in unit, a web which runs transversely with respect to the mount and on which a slide, which latches in stepwise in the direction of the mount, is movable toward the switchboard rear side, to press the holding lugs against the at least one of depressions and apertures and thus fix the built-in unit in the through-opening at first in the intended position, and wherein the holding lugs are pressed so severely against the at least one of depressions and apertures via clamping elements, arranged on the mount to press against the switchboard rear side, that sealing of the through-opening takes place.

2. The fastening as claimed in claim 1, wherein the clamping elements are screws, whose ends bear against the switchboard rear side and press the holding lugs against the at least one of depressions and apertures.

3. The fastening as claimed in claim 1, wherein a seal made from an elastic material is arranged between the collar and the switchboard front side.

4. The fastening as claimed in claim 3, wherein the elastic material is applied to the inside of the collar.

5. A fitting method for fastening a built-in unit on a switchboard, which includes a through-opening through which a rear part of the built-in unit is plugable from the switchboard front side, the rear part of the built-in unit and a contour and size of the through-opening corresponding to one another, the method comprising:

limiting, via a collar arranged on the built-in unit, an action of plugging through the built-in unit; and using at least one fixing and clamping device on the rear part of the built-in unit to enable the built-in unit to assume an intended position on the switchboard and to enable the collar to be pressed with such a pressure against the switchboard that sealing of the through-opening takes place, the using including applying the at least one fixing and clamping device, including holders with at least two holding lugs and spaced apart from one another, on both sides of the built-in unit, the holding lugs being arranged on a mount and engaging in corresponding at least one of depressions and apertures of the built-in unit, and moving a slide, which latches in stepwise, on a web, which runs transversely with respect to the mount, toward the switchboard rear side to press the holding lugs against the at least one of depressions and apertures and thus to fix the built-in unit first in the through-opening in the intended position, and pressing the holding lugs so severely against the at least one of depressions and apertures via clamping elements, arranged on the mount and pressing against the switchboard rear side, that sealing of the through-opening takes place.

6. The method as claimed in claim 5, wherein the clamping elements are screws, whose ends bear against the switchboard rear side and press the holding lugs against the at least one of depressions and apertures.

7. The method as claimed in claim 6, wherein a seal made from an elastic material is arranged between the collar and the switchboard front side.

8. The fastening as claimed in claim 7, wherein the elastic material is applied to the inside of the collar.

* * * * *